(12) United States Patent
Iacovangelo et al.

(10) Patent No.: US 7,595,097 B2
(45) Date of Patent: Sep. 29, 2009

(54) EXPANDING THERMAL PLASMA DEPOSITION SYSTEM

(75) Inventors: Charles D. Iacovangelo, Clifton Park, NY (US); Thomas Miebach, Ballston Spa, NY (US); Michael W. Mercedes, Watervliet, NY (US); Steven M. Gasworth, Farmington Hills, MI (US); Michael R. Haag, Dearborn, MI (US)

(73) Assignee: Exatec, L.L.C., Wixom, MI (US)

( * ) Notice: Subject to any disclaimer, the term of this patent is extended or adjusted under 35 U.S.C. 154(b) by 750 days.

(21) Appl. No.: 11/075,343

(22) Filed: Mar. 8, 2005

(65) Prior Publication Data

US 2005/0202184 A1 Sep. 15, 2005

Related U.S. Application Data

(60) Provisional application No. 60/551,933, filed on Mar. 9, 2004.

(51) Int. Cl.
*H05H 1/24* (2006.01)
(52) U.S. Cl. ..................................... 427/578
(58) Field of Classification Search ................ 427/569, 427/578; 118/715
See application file for complete search history.

(56) References Cited

U.S. PATENT DOCUMENTS

| 4,871,580 | A | 10/1989 | Schram et al. |
| 4,957,062 | A | 9/1990 | Schuurmans et al. |
| 5,156,882 | A | 10/1992 | Rzad et al. |
| 5,481,081 | A | 1/1996 | Ikegaya et al. |
| 5,560,779 | A | 10/1996 | Knowles et al. |
| 5,846,330 | A | 12/1998 | Quirk et al. |
| 6,110,544 | A | * | 8/2000 | Yang et al. ................... 427/580 |
| 6,213,049 | B1 | * | 4/2001 | Yang ....................... 118/723 R |
| 6,261,694 | B1 | | 7/2001 | Iacovangelo |
| 6,397,776 | B1 | * | 6/2002 | Yang et al. ............. 118/723 MP |
| 6,420,032 | B1 | * | 7/2002 | Iacovangelo ................. 428/412 |
| 6,426,125 | B1 | * | 7/2002 | Yang et al. ................... 427/488 |
| 6,432,494 | B1 | | 8/2002 | Yang et al. |
| 6,517,687 | B1 | | 2/2003 | Iacovangelo |
| 6,681,716 | B2 | | 1/2004 | Schaepkens |
| 6,872,428 | B2 | | 3/2005 | Yang et al. |
| 6,890,656 | B2 | | 5/2005 | Iacovangelo et al. |
| 2003/0097988 | A1 | | 5/2003 | Schaepkens |
| 2004/0040833 | A1 | | 3/2004 | Schaepkens et al. |

OTHER PUBLICATIONS

Meeusen, Plasma Beam Deposition of Amorphous Hydrogenated Silicon, Thesis, University of Eindhoven, 1994, p. 1-19.*

* cited by examiner

*Primary Examiner*—Timothy H Meeks
*Assistant Examiner*—Elizabeth Burkhart
(74) *Attorney, Agent, or Firm*—Brinks Hofer Gilson & Lione

(57) ABSTRACT

A system to coat a substrate includes a deposition chamber maintained at sub-atmospheric pressure, one or more arrays containing two or more expanding thermal plasma sources associated with the deposition chamber, and at least one injector containing orifices for each array. The substrate is positioned in the deposition chamber and each expanding thermal plasma source produces a plasma jet with a central axis, while the injector injects vaporized reagents into the plasma to form a coating that is deposited on the substrate. The injector orifices are located within a specified distance from the expanding thermal plasma source to obtain generally a coating with generally uniform coating properties.

23 Claims, 7 Drawing Sheets

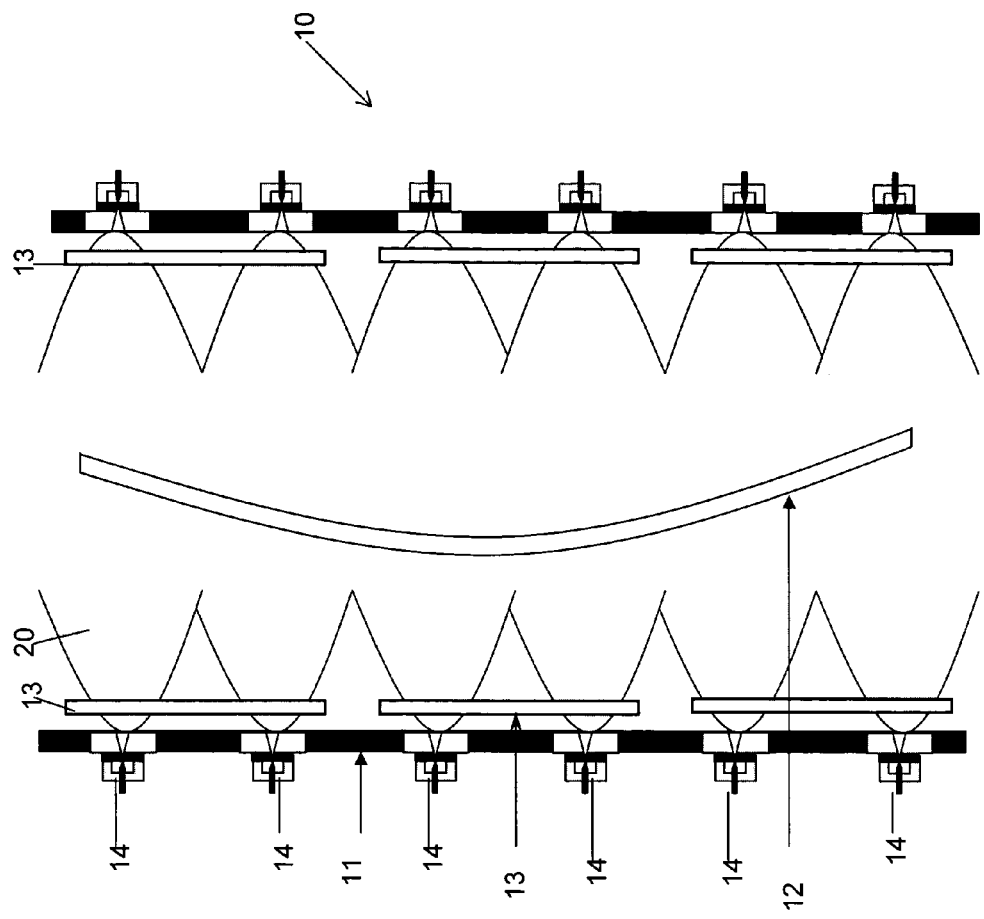
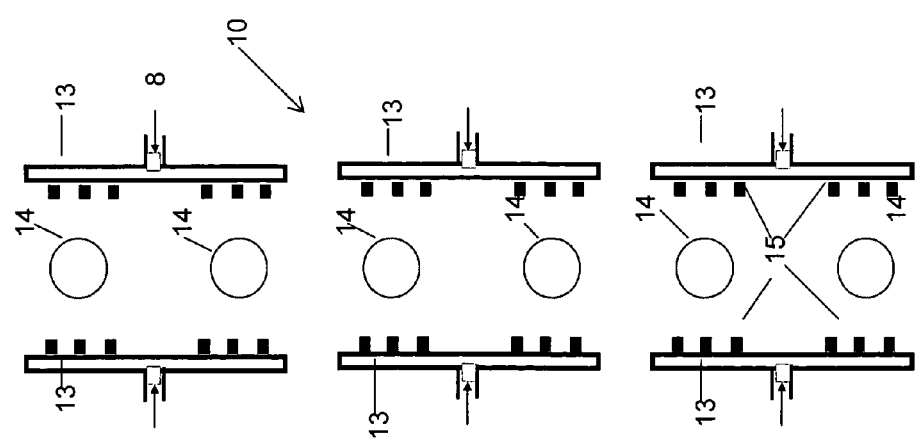

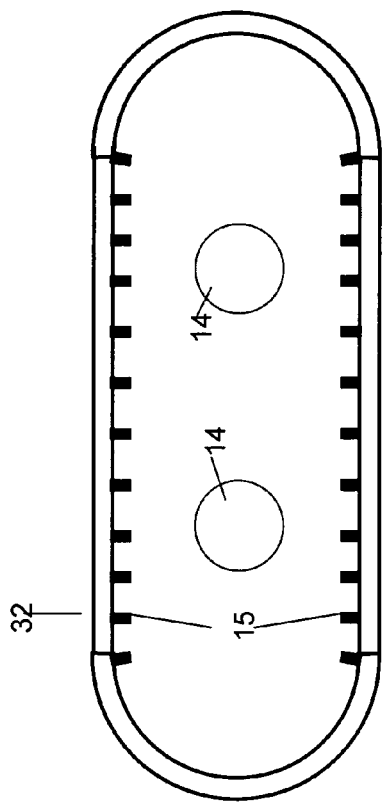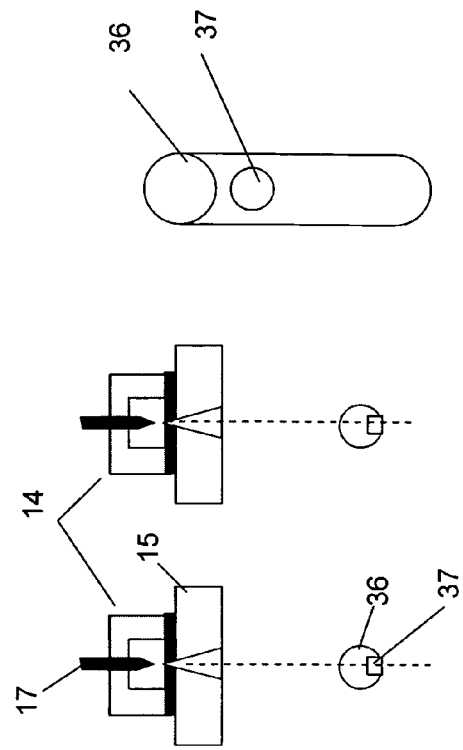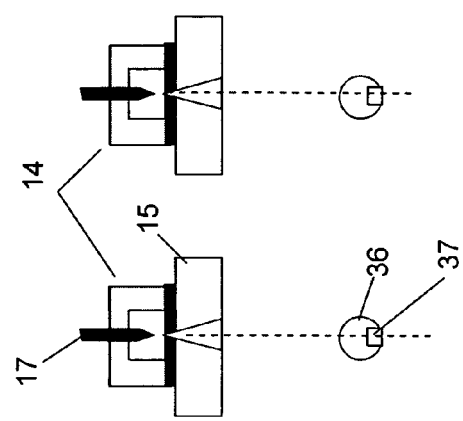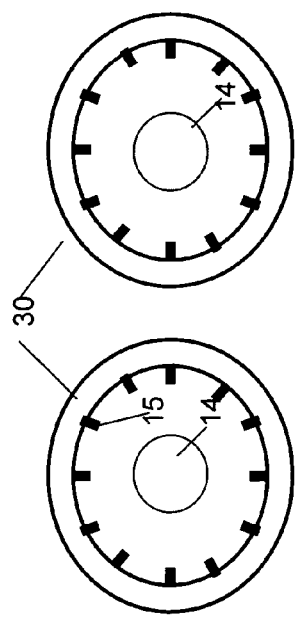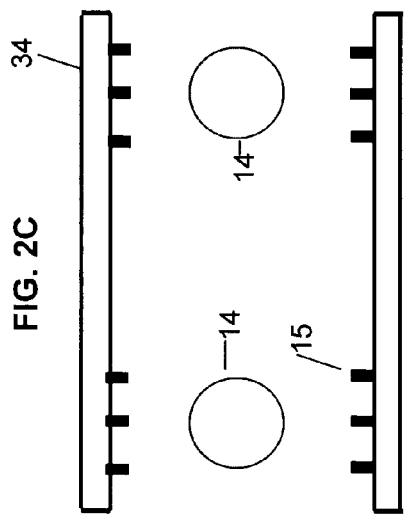

EXPANDING THERMAL PLASMA DEPOSITION SYSTEM

RELATED APPLICATION

This application claims the benefit of U.S. Provisional Application No. 60/551,933, filed Mar. 9, 2004, the entire contents of which are incorporated herein by reference.

BACKGROUND

The present invention generally relates to a system and process for coating large substrates with coatings having uniform properties. More specifically, the invention relates to expanding thermal plasma deposition.

A variety of techniques exist for coating substrates with functional coatings. Traditionally thermal chemical vapor deposition (CVD) and physical vapor deposition such as sputtering and evaporation have been used. These techniques, however, require high deposition temperatures, which limit the substrates that can be coated, and further involve very slow deposition rates. More recently, plasma enhanced chemical vapor deposition (PECVD) processes have been developed to overcome some of these limitations. PECVD can be used to deposit materials on plastic substrates such as polycarbonates, which was generally not feasible with CVD at temperatures lower than the glass transition temperature of the plastic. In PECVD, the applied electric field enhances the formation of the ionized species, providing a much higher percentage of ionized species that permits the use of low deposition temperatures, e.g. as low as room temperature. However, PECVD still does not generally provide a deposition rate that is high enough to be commercially viable for many applications involving polycarbonates coated with UV absorbing and abrasion-resistant layers. In addition, PECVD has not been demonstrated on large complex shapes but rather has been restricted to planar substrates or non-planar substrates with very mild curvature such as ophthalmic lenses.

Another method of treating polycarbonates involves the application of a silicone hardcoat to the polycarbonate substrate. The silicone hardcoat is applied in a wet process, for example, by dipping the polycarbonate in a silicone bath or by spraying silicone on the polycarbonate. The silicone hardcoat provides limited abrasion resistance to the polycarbonate and may also include a constituent that absorbs UV radiation. This process, however, is relatively slow, since the silicone hardcoat must be dried and cured which can take a few hours, and the silicone hardcoating solution has a limited shelf life. Moreover, the process generates waste chemicals and produces a generally nonuniform thickness due to gravitational effects during application, drying and curing.

As seen from the above, there exists a need for an apparatus and process that will provide uniform coating properties over large areas and complex shapes.

SUMMARY

The present invention is a directed to a system and a process to coat a substrate. The system includes a deposition chamber maintained at sub-atmospheric pressure, two or more expanding thermal plasma (ETP) sources associated with the deposition chamber, and at least one injector. The substrate is positioned in the deposition chamber and each ETP source produces a plasma jet with a central axis, while the injector injects vaporized reagents into the plasma to form a coating that is deposited on the substrate. The injection of the reagents is located within a specified distance from the central axis to obtain generally a coating with generally uniform coating properties, even though the reagent injection may be non-uniform.

Among other advantages, the present invention may provide high deposition rates, low deposition temperatures, and generally uniform properties over large areas of complex shapes.

Further features and advantages of this invention will become readily apparent from the following description, and from the claims.

BRIEF DESCRIPTION OF THE DRAWINGS

FIG. 1A is a front view of a coating station with ETP sources and injection manifolds in accordance with an embodiment of the invention.

FIG. 1B is a side view of the coating station of FIG. 1A.

FIG. 2A shows an alternative arrangement of ETP sources with ring injectors in accordance with the invention.

FIG. 2B shows another alternative arrangement of ETP sources with a racetrack injector in accordance with the invention.

FIG. 2C shows yet another alternative arrangement of ETP sources with straight tube manifold injectors in accordance with the invention.

FIGS. 2D and 2E show top view and a front view, respectively, of ETP sources with single-point injector tubes in accordance with the invention.

DETAILED DESCRIPTION

Figure 3:
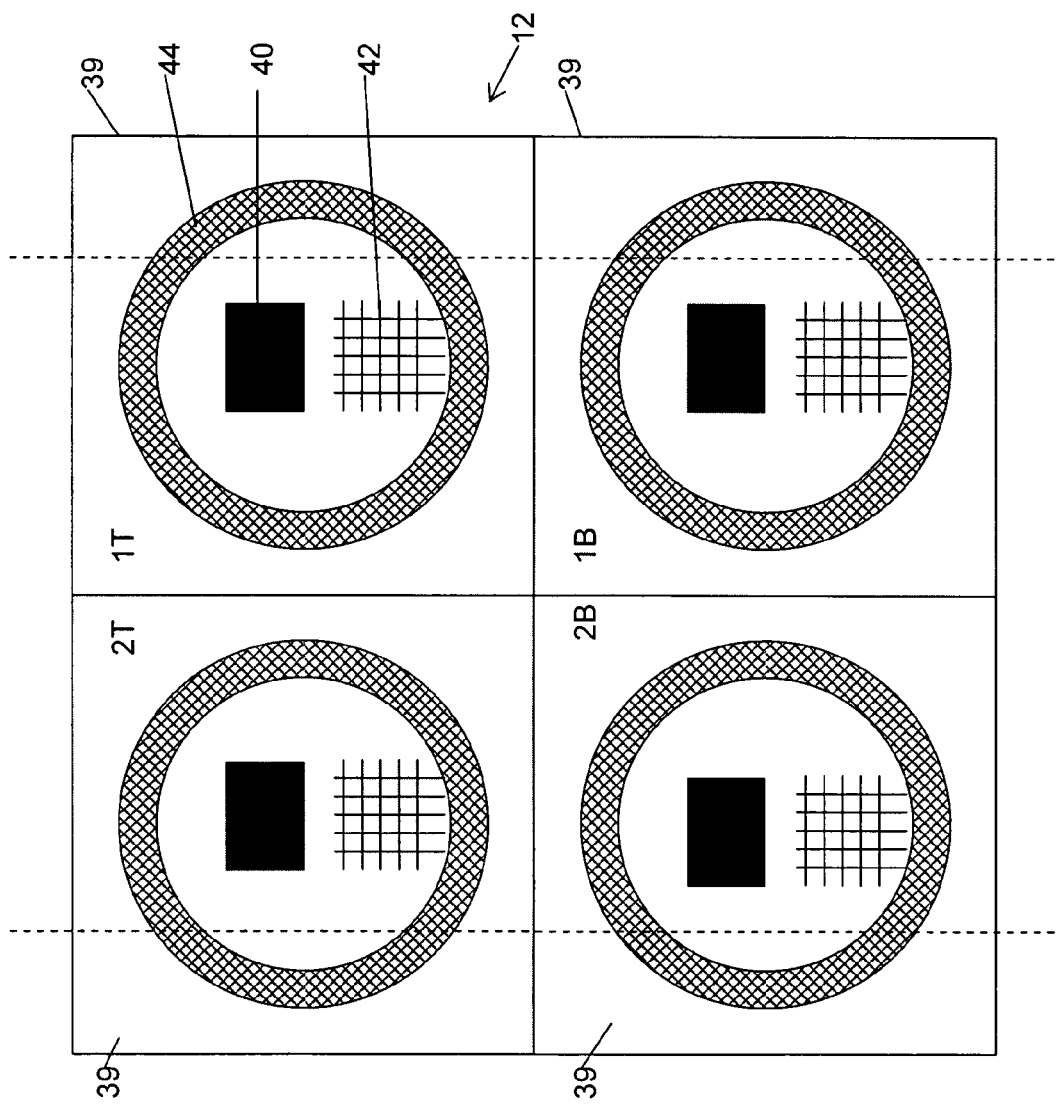
FIG. 3 is a front view of a substrate setup.

Referring now to FIGS. 1A and 1B, there is shown a coating station 10 in which a substrate 12 follows a fixed linear path through the coating station. The translation direction is left to right with respect to FIG. 1A and into the page with respect to FIG. 1B. Any suitable mechanism may be employed to move the substrate through the coating station 10. The substrate 12 may be a component for an automotive vehicle. For example, the substrate may be a rear window or roof panel. The substrate 12 may include a polycarbonate. Polycarbonates suitable for forming substrates generally include repeating units of the formula:

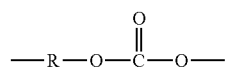

where R is a divalent aromatic radical of a dihydric phenol (e.g., a radical of 2,2-bis(4-hydroxyphenyl)-propane, also known as bisphenol A) employed in the polymer producing reaction; or an organic polycarboxylic acid (e.g. terphthalic acid, isophthalic acid, hexahydrophthalic acid, adipic acid, sebacic acid, dodecanedioic acid, and the like). These polycarbonate resins are aromatic carbonate polymers which may be prepared by reacting one or more dihydric phenols with a carbonate precursor such as phosgene, a haloformate or a carbonate ester. One example of a polycarbonate which can be used is LEXAN®, manufactured by the General Electric Company (GE) in Fairfield, Conn., Aromatic carbonate polymers may be prepared by methods as described, for example, in U.S. Pat. Nos. 3,161,615; 3,220,973; 3,312,659; 3,312,660; 3,313,777; 3,666,614; 3,989,672; 4,200,681; 4,842,941; and 4,210,699, all of which are incorporated herein by reference in their entirety.

The substrate 12 may also include a polyestercarbonate which can be prepared by reacting a carbonate precursor, a dihydric phenol, and a dicarboxylic acid or ester forming derivative thereof. Polyestercarbonates are described, for example, in U.S. Pat. Nos. 4,454,275; 5,510,448; 4,194,038; and 5,463,013, which are incorporated herein by reference in their entirety.

The substrate may also include a thermoplastic or thermoset material. Examples of suitable thermoplastic materials include polyethylene, polypropylene, polystyrene, polyvinylacetate, polyvinylalcohol, polyvinylacetal, polymethacrylate ester, polyacrylic acids, polyether, polyester, polycarbonate, cellulous resin, polyacrylonitrile, polyamide, polyimide, polyvinylchloride, fluorine containing resins and polysulfone. Examples of suitable thermoset materials include epoxy and urea melamine.

Acrylic polymers are another material from which the substrate 12 may be formed. Acrylic polymers can be prepared from monomers such as methyl acrylate, acrylic acid, methacrylic acid, methyl methacrylate, butyl methacrylate, cyclohexyl methacrylate, and the like. Substituted acrylates and methacrylates, such as hydroxyethyl acrylate, hydroxybutyl acrylate, 2-ethylhexylacrylate, and n-butylacrylate may also be used.

Polyesters can also be used to form the substrate 12. Polyesters may be prepared by the polyesterification of organic polycarboxylic acids (e.g., phthalic acid, hexahydrophthalic acid, adipic acid, maleic acid, terphthalic acid, isophthalic acid, sebacic acid, dodecanedioic acid, and the like) or their anhydrides with organic polyols containing primary or secondary hydroxyl groups (e.g., ethylene glycol, butylene glycol, neopentyl glycol, and cyclohexanedimethanol).

Polyurethanes are another class of materials that can be used to form the substrate. Polyurethanes are well-known in the art, and are prepared by the reaction of a polyisocyanate and a polyol. Examples of useful polyisocyanates include hexamethylene diisocyanate, toluene diisocyanate, MDI, isophorone diisocyanate, and biurets and triisocyanurates of these diisocyanates. Examples of useful polyols include low molecular weight aliphatic polyols, polyester polyols, polyether polyols, fatty alcohols, and the like.

Examples of other materials from which the substrate 12 may be formed include acrylonitrile-butadiene-styrene, glass, VALOX® (polybutylenephthalate, available from General Electric Co.), XENOY® (a blend of LEXAN® and VALOX®, available from General Electric Co.), and the like.

The substrate may also contain other functional coatings. For example, the substrate may contain a silicone hardcoat and primer whose function is to provide adhesion, UV filtering, and some abrasion resistance. Examples of organosilicon compositions which can be employed as hardcoats are compounds represented by the general formula:

$$R^1_n SiZ_{(4-n)}$$

wherein $R^1$ represents a monovalent hydrocarbon radical or a halogenated monovalent hydrocarbon radical, Z represents a hydrolyzable group, and n may vary between 0 and 2. More specifically, Z is typically a member such as halogen, alkoxy, acyloxy, or aryloxy. Such compounds are described, for example, in U.S. Pat. No. 4,224,378 to Schroeter et al., the entire contents of which are incorporated herein by reference.

Other examples of organosilicons which may be employed include silanols having the formula:

$$R^2 Si(OH)_3$$

wherein $R^2$ is selected from the group including alkyl radicals containing from about 1 to about 3 carbon atoms, the vinyl radical, the 3,3,3-trifluoropropyl radical, the gamma-glycidoxypropyl radical and the gamma-methacryloxypropyl radical, with at least about 70% by weight of the silanol being $CH_3Si(OH)_3$. Such compounds are described in U.S. Pat. No. 4,242,381, which is incorporated herein by reference in its entirety.

Other functional coatings include inorganic UV filters, moisture and oxygen barriers, infra-red (IR) reflecting coatings, anti-reflecting (AR) coatings, transparent conducting oxides (TCOs), planarization layers, defrosters, black out inks, and the like. Typical UV filters include ZnO, ZnS, $TiO_2$, $CeO_2$, $SnO_2$ and combinations of these materials. They could also be doped with for example, Al, In, F, B, and N to improve the UV absorbency, water immersion stability, and electrical conductivity. Typical moisture and oxygen barriers include $SiO_2$, $Si_3N_4$, $TiO_2$, $Al_2O_3$, AlN, and combinations of these materials. Typical IR reflecting coatings include multilayer stacks of high and low refractive index dielectric materials such as $SiO_2$, $Si_3N_4$, $TiO_2$, ZnO and the like. Another IR reflecting coating includes multilayer stacks of these dielectric materials and metals such as Al, and Ag. Examples of TCOs include aluminum-doped ZnO (AZO), indium-doped ZnO (IZO) indium tin oxide (ITO) and the like.

The substrate 12 can be formed in a conventional manner, for example by injection molding, extrusion, cold forming, vacuum forming, blow molding, compression molding, transfer molding, thermal forming, and the like. The article may be in any shape and need not be a finished article of commerce, that is, it may be sheet material or film that is cut or sized or mechanically shaped into a finished article. The substrate may be transparent or not transparent. The substrate may be rigid or flexible.

The substrate can be washed if desired, e.g. with a variety of aqueous soaps and cleaners and or solvents such as isopropyl alcohol, and optionally vacuum dried at about 80° C. overnight before plasma deposition. The substrate can also be cleaned in situ with a plasma pretreatment cleaning step (also referred to as "etching") in which the plasma is generated with argon or with argon and oxygen to remove or oxidize contaminants on the surface of the substrate prior to deposition.

The coating station 10 includes an array of ETP sources 14, an anode 15 and a cathode 17 (FIG. 2D), on opposite sides of the coating station 10, as well as associated reagent manifolds and oxygen manifolds 13. The coating station 10 may be associated with one or more heaters located upstream of the coating station to heat the substrate before it enters the coating station. An additional coating station may be located downstream of coating station 10 to provide further plasma coating capabilities, in which case another heater may be located between the two coating stations.

During the operation of the coating station 10, the ETP sources 14 are typically fed with an inert gas, such as argon, into a cathode where it is partially ionized and issues into a vacuum deposition chamber 11 as plasma jets 20 (from the respective ETP sources) directed towards the substrate 12. Coating reagents and oxygen 8 are injected in vapor form by orifices 15 distributed on the respective manifolds 13 into the plasma.

Examples of materials that can be injected into the plasma to form the adhesion and abrasion-resistant layer coatings include organosilicons, as well as hydrocarbons such as ethyl benzene and straight chain hydrocarbons such as butane. "Organosilicons" as used herein is meant to encompass organic compounds in which at least one silicon atom is bonded to at least one carbon atom, and includes silicone materials, as well as materials commonly referred to as silanes, siloxanes, silazanes, and organosilicons. Many of the organosilicons suitable for use in the coating station 10 are described in Organic Polymer Chemistry, K. Saunders, Chapman and Hall Ltd., 1973, the entire contents of which are incorporated herein by reference. Examples of organosilicon precursors for forming adhesion layers and/or abrasion-resistant layers include octamethylcyclotetrasiloxane (D4), decamethylcyclopentasiloxane (D5), tetravinyltetramethylcyclotetrasiloxane (V-D4), tetramethyldisiloxane (TMDSO), dimethyldimethoxysilane (DMDMS) and hexamethyldisiloxane (HMDSO), and vinyltrimethylsilane (VTMS).

Examples of functional coatings and the associated precursors include: inorganic UV filters from dimethylzinc (DMZ), diethylzinc (DEZ), zinc vapor, titanium tetrachloride, titanium-alkoxides, cerium alkoxides and diketonates; dopants and dielectrics from trimethylaluminum, triethylaluminum, aluminum alkoxides, aluminum vapor, trimethylindium, triethylindium, indium diketonates; TCOs from vinyltrimethylsilane (VTMS), silane, tin alkoxides and diketonates. Useful oxidants include oxygen, water, ammonia, hydrogen sulfide, hexamethyldisilthiane, fluoride, $CF_4$, and $NF_3$.

While a single abrasion-resistant layer coating involves a tradeoff between adhesion and abrasion resistance, multilayer abrasion-resistant coatings of two or more compositions can meet both the requirements. Typically, the first layer is deposited with less injected oxygen than for subsequent layers. This results in a lower degree of oxidation of the organosilicon resulting in a coating that typically has a lower oxygen content, is softer, and performs better in water immersion tests. As such, the examples described below were formed with two or more abrasion-resistant layers, and with different oxygen content in at least the first layer.

In accordance with the invention, the coating station 10 deposits coatings with uniform properties over large areas of substrates 12. To obtain uniform coating properties using multiple ETP sources 14, reagents are injected within a specified distance from the ETP source centerline.

As shown in FIGS. 2A-2E, this approach can be implemented with ring manifolds 30, racetrack manifolds 32, straight tube manifolds 34, or single-point tube injectors 36 to achieve uniform coating properties, such as thickness, abrasion resistance, and adhesion after water immersion, over substrates with large surface areas and complex shapes. This can be achieved without the complications of changing process parameters during the coating operation for each part and without articulating the ETP sources. In certain implementations, the ETP sources 14 are spaced apart by about 6 inches, and the injector orifices are within about 0.1 to 4 inches from the ETP source centerline preferably within about 2 inches from the ETP source centerline.

In many applications, such as automotive windows, where the coated substrate is exposed to outdoor weathering, it is beneficial that the coating maintain Taber abrasion resistance upon long term exposure to UV radiation. Co-pending application, Ser. No. 11/075,341, filed herewith discusses that the degradation of the abrasion resistance is correlated with UV absorbency of the coating. Thus, in certain implementations, the coating provides low UV absorbency, preferably less than 0.02 micrometer$^{-1}$ at 300 nm.

Various features of the invention are illustrated by the following examples, which are not to be construed as limitations on the scope of the invention.

EXAMPLE 1

In this example, Lexan® MR10 sheets, available from General Electric, were coated with plasma polymerized and oxidized D4. In the coating process, two stationary ETP sources 14 spaced approximately 16 cm apart in the horizontal plane were used to cover approximately 64 in$^2$ of substrate. Four 4 inch×4 inch samples (plaques) 39 were loaded on an aluminum holder, as shown in FIG. 3. The substrate was translated vertically past the ETP sources 14 at a scan speed of about 2.3 cm/sec. The rectangles 40 indicate typical positions of silicon chips. The coating thickness on these chips was measured by ellipsometry. Silicon chips were placed every 1 inch along the substrates in both a vertical and horizontal straight line during experiments where coating thickness profiles were generated. The cross hatches 42 are the locations where the coating adhesion was measured before and after a 3-day immersion in 65° C. water. The rings 44 indicate the tracks of the Taber wheels after the ASTM D1044 Taber abrasion test. The Taber abrasion test was conducted with CS10F wheels and 1000 cycles. The vertical dashed lines indicate the paths of the centerlines of the respective ETP sources 14 as the substrate is translated. Note that the paths of the centerlines of the ETP sources are also indicated by vertical dashed lines in FIGS. 4-7.

The substrates were preheated to approximately 120° C. prior to deposition. The coating was applied in two steps. For the first layer, the plasma conditions were 1.65 standard liters per minute (slm) argon, 0.3 slm oxygen, 0.19 slm D4, and 70 amps to each arc. In the second layer, the conditions were the same except the oxygen flow was increased to 1.0 slm. The distance from the anode of the ETP source 14 to the substrate (i.e., the working distance WD) was about 25.5 cm. The time delay between the two steps was about one minute. In all examples, the argon was fed to the cathode housing. In this example, the D4 and oxygen were injected into the plasma through circular rings located about 1⅛ inches downstream from the anode of each ETP source and placed concentric to the centerline of the ETP source. The injection of D4 was about two inches from the ETP source centerline through twelve approximately 0.04 inch orifices equally spaced around the ring, as shown in FIG. 2A. Injection of oxygen was through a separate, but similar ring located directly against the reagent ring, on the side closer to the substrate.

Figure 4:
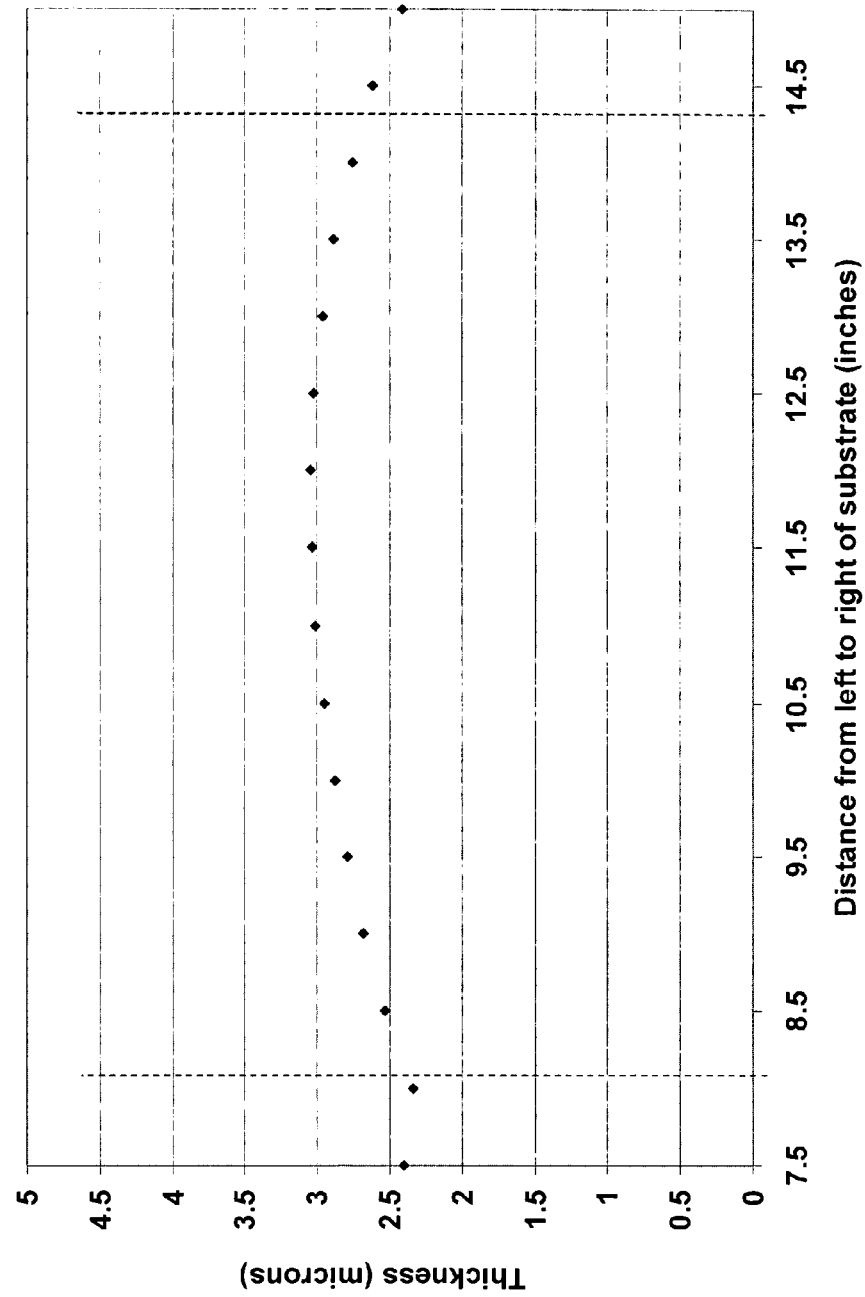
FIG. 4 is a graphical representation of the coating thickness profile over a substrate, using two ETP sources and ring injectors.

Shown in FIG. 4 is a graphical representation of the coating thickness uniformity across the substrates. As shown, the coating thickness was everywhere within about 10% of the mean thickness. The initial coating adhesion was 5 B as measured by ASTM D3359 cross hatch test, and the average adhesion after water immersion was 4.2 B. The Taber delta haze of the coating was between 2% and 6% with an average of 4.1%±1.2% (±indicates standard deviation) for twelve plaques from three runs.

EXAMPLE 2

The process was similar to that of Example 1, but a single racetrack manifold 32 was used to inject the D4, as shown in FIG. 2B. Injection of oxygen was through a separate, but identical racetrack located directly against the D4 racetrack, on the side closer to the substrate. The racetrack 32 encircled both ETP sources 14 about 2 inches from the ETP centerlines at the closest approach. The plane of the racetrack was about 1⅛ inches downstream of the plane of the anodes. In this example, the D4 was injected through approximately 0.04 inch orifices uniformly spaced about 0.5 inches apart along the racetrack, covering a total distance of about 11.5 inches along each straight section of the racetrack.

Figure 5:
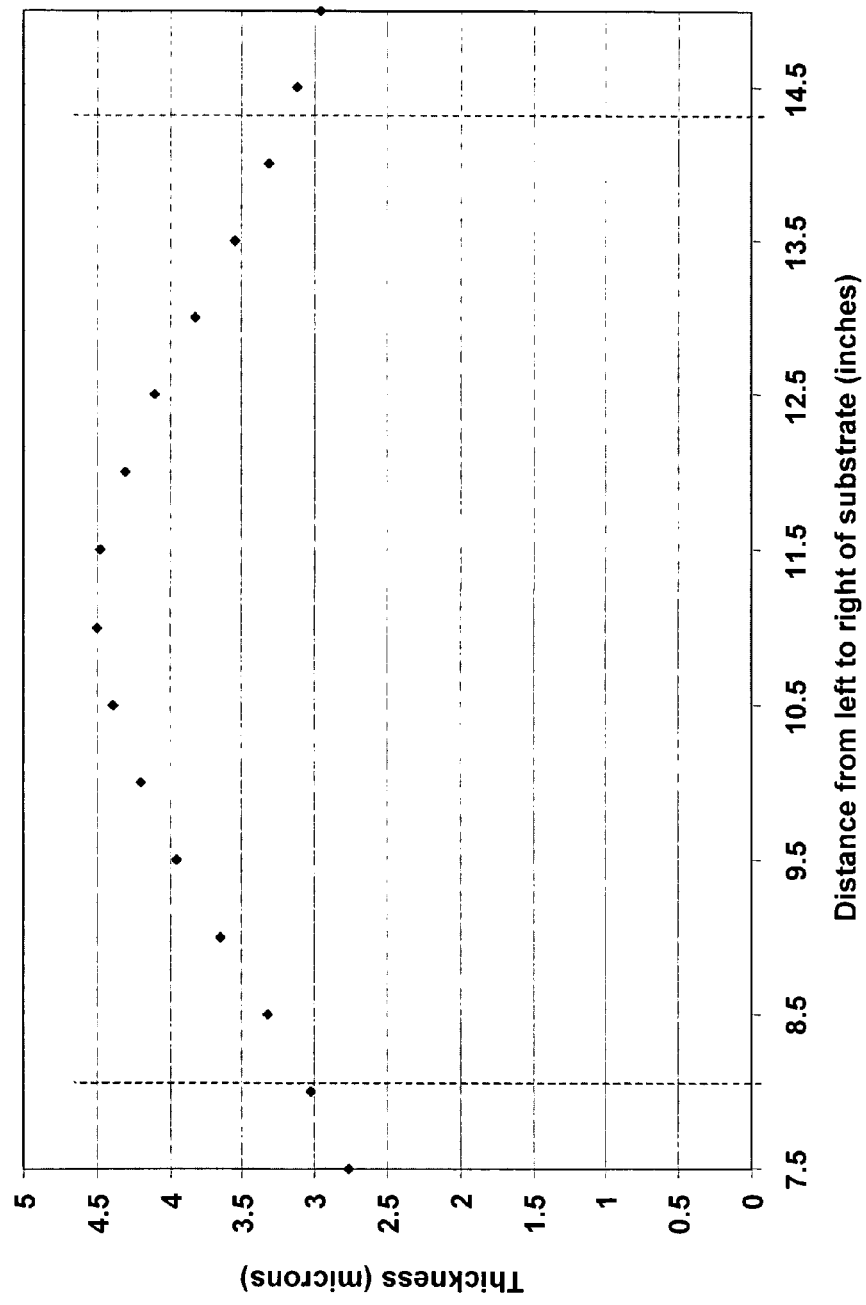
FIG. 5 is a graphical representation of the coating thickness profile over a substrate, using two ETP sources and a racetrack injector with uniformly distributed orifices.

FIG. 5 shows that the coating thickness was 45% thicker in the overlap region between the ETP sources when compared to the ETP centerlines. The coating had an average adhesion after water immersion of 3.1 B, and a very high standard deviation of 1.0 B, such that several areas had adhesion of less than 2 B. The Taber uniformity was the same as in Example 1, with delta haze values between 2% and 6%, and an average delta haze of 4.4%±1.8% for eight plaques from four runs. Comparing Examples 1 and 2 demonstrates that the injection location affects coating adhesion and thickness uniformity.

EXAMPLE 3

Figure 6:
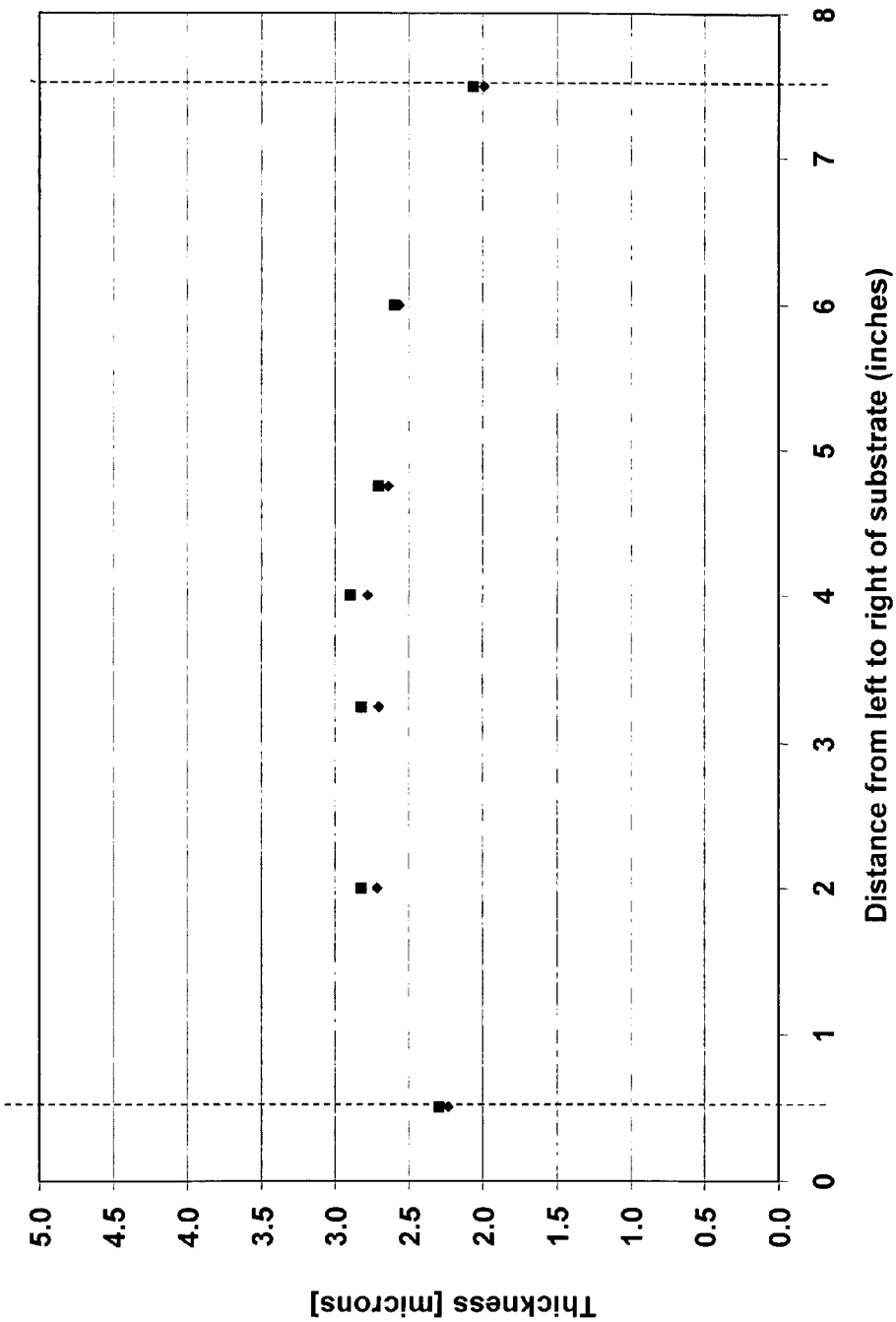
FIG. 6 is a graphical representation of the coating thickness profile over a substrate, using two ETP sources and a racetrack injector with injection orifices only within 1.8 inches of the anode orifice of each ETP source.

The injection method was similar to that of Example 2, except only the orifices located within a 1.8 inch of the ETP source centerline were used to inject oxygen and D4, as illustrated in FIG. 2C. FIG. 6 shows that a more uniform coating was obtained, as compared to FIG. 5, with the coating thickness everywhere within about 10% of the mean thickness. This coating also was well-adhered, with all ten plaques from four runs exhibiting 5B initial adhesion and an average of 3.6 B±0.6 B adhesion after 3-day water immersion. Excellent Taber abrasion uniformity was achieved, with an average value of 1.9% and a very low standard deviation of ±0.6%.

EXAMPLE 4

Figure 7:
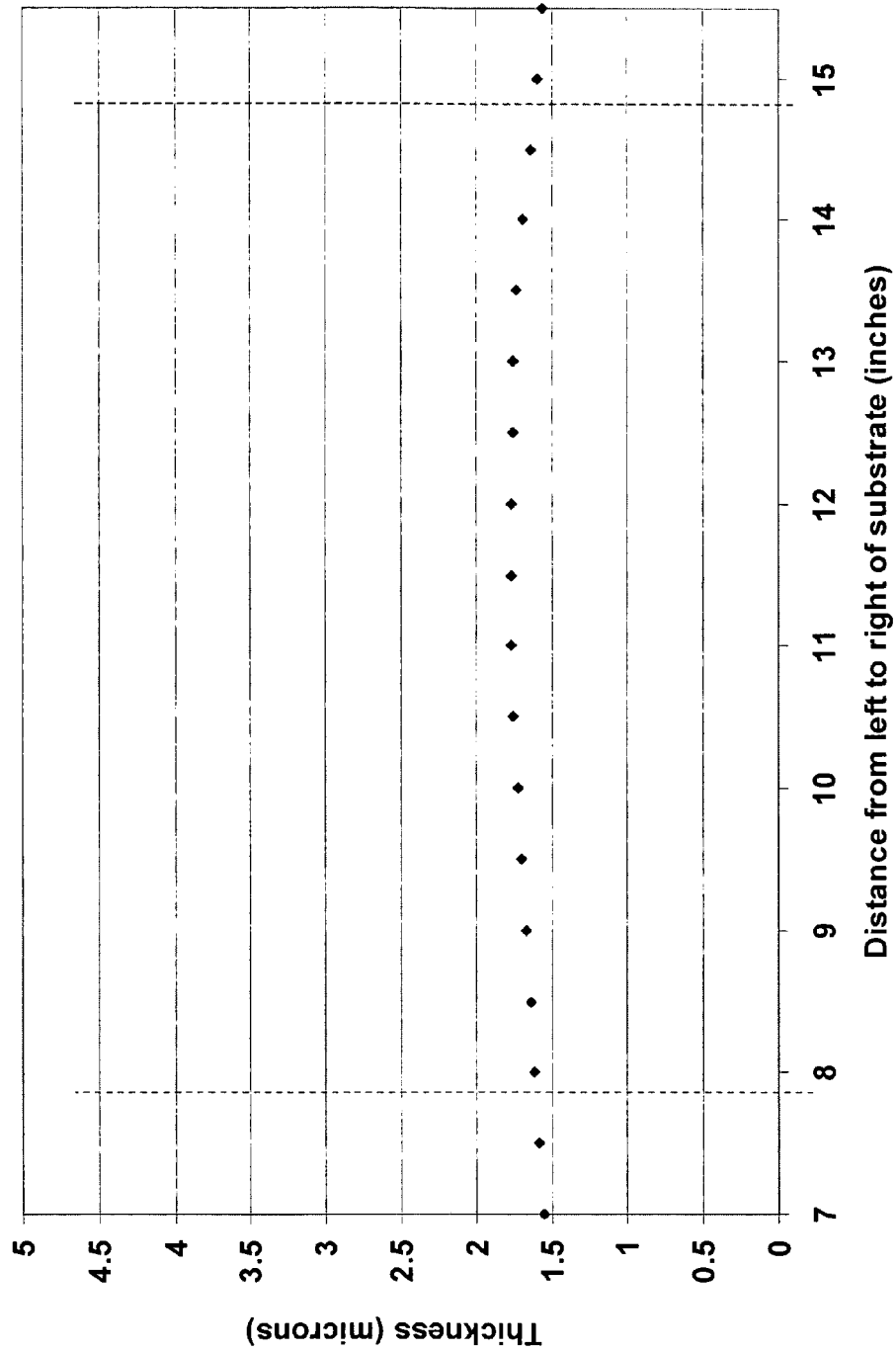
FIG. 7 is a graphical representation of the coating thickness profile over a substrate, using two ETP sources and single-point tube injectors.

The process was similar to that of Example 2, except both the D4 and oxygen were injected through a single tube 36 with a 0.25 inch outside diameter and an injection hole 37 with a diameter of 0.156 inches, located 1⅛ inches downstream from the anode, as illustrated in FIGS. 2D and 2E. As shown in FIG. 7, the coating thickness everywhere was within about 5% of the mean thickness. Taber uniformity was also very good, with values from 2% to 4%, an average of 3.3%, and a low standard deviation of 0.8%. In addition, all locations tested on the four plaques had an initial adhesion rating of 5 B, and a post water immersion adhesion of 4.0 B.

Comparing Examples 1, 3, and 4 with Example 2 demonstrates that for coating thickness uniformity, Taber abrasion, and adhesion after water immersion, it is desirable to inject the reactants, especially the organosilicon, within approximately 2 inches from the ETP source centerline. Uniform injection typically practiced in PECVD deposition, represented by comparative Example 2, results in non-uniform thickness and poor Taber abrasion and water immersion performance when combined with discrete ETP sources.

EXAMPLE 5

The process in Example 5 was the same as used in Example 1, except three abrasion-resistant layers were applied. The first layer was identical to layer 1 of Example 1, using 0.3 slm oxygen, and the second and third layers were identical to layer two of Example 1, employing 1.0 slm oxygen. A mean thickness of 3.5 microns was obtained and the Taber delta haze improved to 2.69%±0.3%. This Taber delta haze is both lower and more uniform when compared to the Taber in Example 1, which averaged 4.3%±1.2%.

EXAMPLE 6

The process in this example was similar to that of Example 1 except a ZnO coating was deposited. The argon flow rate and ETP power were the same and zinc as a vapor from a thermal evaporator was feed at 0.5 slm. The oxygen flow rate was 5 slm. A ZnO coating with a mean thickness 0.5 microns was achieved. The UV absorbance was 3 at 350 nm.

EXAMPLE 7

The process in this example was similar to that of Example 1 except a PC substrate with no wet coat was used. An adhesion layer was deposited with the following conditions: 1.65 slm argon, 30 amps, no oxygen, 0.03 slm V-D4 at 45 mTorr. A coating with a mean thickness of 0.3 microns was obtained. Water immersion performance was 5 B after 14 days.

EXAMPLE 8

A six-layer coating was deposited onto polycarbonate according to the process used in example 1. The first layer was an adhesion layer similar to that in Example 7. The second coating was a UV absorbance layer of ZnO deposited according to the process used in Example 6. The third layer was a D4 abrasion-resistant layer deposited according to the process used in Example 1 with 0.3 slm oxygen. Layers 4 through 6 were abrasion-resistant layers deposited according to process of Example 1 with 0.8 slm oxygen. The resulting coating was about 7 microns thick, had a Taber delta haze than 2%, and passed three day-water immersion.

Other embodiments are within the scope of the following claims.

What is claimed is:

1. A process for coating a substrate comprising:
    generating a plasma from two or more ETP sources, each ETP source including an anode having an orifice and defining a central axis; and
    moving a substrate past each ETP source in a direction transverse to the central axis;
    injecting vaporized reagents into the plasma to form the coating on the substrate, the injection of the reagents being injected apart from the ETP source and at a specified distance from the central axis in the region between the anode and the substrate, the specified distance being selected to obtain one or more uniform coating properties over the substrate.

2. The process of claim 1 wherein the uniform coating property is the coating thickness.

3. The process of claim 1 wherein the uniform coating property is the abrasion resistance of the coating.

4. The process of claim 1 wherein the uniform coating property is adhesion of the coating to the substrate after water immersion.

5. The process of claim 1 wherein the coating is a plasma polymerized and oxidized organosilicon.

6. The process of claim 5 wherein the organosilicon is selected from the group consisting of DMDMS, HMDSO, TMDSO, D4, and D5.

7. The process of claim 1 wherein the coating is an abrasion-resistant coating with an UV absorbency of less than about 0.02 micrometer$^{-1}$ at about 300 nm.

8. The process of claim 7 wherein two abrasion-resistant layers of different composition are coated on the substrate.

9. The process of claim 8 wherein the compositions differ in percent oxygen and hardness.

10. The process of claim 9 wherein the softer layer is closer to the substrate.

11. The process of claim 7 wherein three or more abrasion-resistant layers are coated on the substrate.

12. The process of claim 11 wherein one layer is softer than the others, the softer layer being closest to the substrate.

13. The process of claim 1 wherein the coating is an adhesion layer.

14. The process of claim 13 wherein the adhesion layer is selected from the group consisting of V-D4, D4, D5, VTMS, HMDSO, DMDMS, and TMDSO.

15. The process of claim 1 wherein the substrate contains a silicone hardcoat.

16. The process of claim 1 wherein the substrate contains a primer and a silicone hardcoat.

17. The process of claim 1 wherein the substrate is a plastic.

18. The process of claim 17 wherein the plastic is a polycarbonate.

19. The process of claim 1 wherein the coating includes an adhesion layer and an abrasion-resistant layer.

20. The process of claim 1 wherein the coating is a functional coating including inorganic UV filters, IR coatings, AR coatings, TCOs, barrier coatings, and combined multilayers.

21. The process of claim 1 wherein the reagent is injected into the plasma through an injector orifice located within about 0.1 to 4 inches from the central axis of the ETP source.

22. The process of claim 21 wherein the reagent is injected into the plasma within 2 inches from the central axis of the ETP source anode.

23. The process of claim 1 wherein the uniform coating property is UV absorption.

* * * * *